United States Patent
Pulvirenti et al.

[19]

[11] Patent Number: 5,422,587
[45] Date of Patent: Jun. 6, 1995

[54] DRIVING CIRCUIT FOR A FIELD EFFECT TRANSISTOR IN A FINAL SEMIBRIDGE STAGE

[75] Inventors: Francesco Pulvirenti, Catania; Roberto Gariboldi, Milan, both of Italy

[73] Assignee: SGS-Thomson Microelectronics S.r.l., Milan, Italy

[21] Appl. No.: 180,102

[22] Filed: Jan. 11, 1994

[30] Foreign Application Priority Data

Jan. 29, 1993 [EP] European Pat. Off. ............ 93830034

[51] Int. Cl.[6] .................................. H03K 17/687
[52] U.S. Cl. .................................. 327/427; 327/389
[58] Field of Search ............... 307/571, 572, 575, 577, 307/359, 350, 491

[56] References Cited

U.S. PATENT DOCUMENTS

| | | | |
|---|---|---|---|
| 4,603,269 | 7/1986 | Hochstein | 307/575 |
| 4,672,246 | 6/1987 | Donovan | |
| 5,083,051 | 1/1992 | Whatley et al. | 307/571 |

FOREIGN PATENT DOCUMENTS

| | | |
|---|---|---|
| 0427086A3 | 5/1991 | European Pat. Off. |
| 4170815 | 6/1992 | Japan |
| 5102821 | 4/1993 | Japan ............ 307/571 |

Primary Examiner—Timothy P. Callahan
Assistant Examiner—Toan Tran
Attorney, Agent, or Firm—Seed and Berry

[57] ABSTRACT

A drive circuit for a field-effect transistor is disclosed, the field-effect transistor having a drain terminal connected to the positive pole of a voltage supply and a source terminal connected to a load. The drive circuit comprises a first transistor connected between the gate terminal of the field-effect transistor and the negative pole of the voltage supply for turning off the field-effect transistor. The first transistor is driven by an operational amplifier which has inverting and non-inverting teminals connected to the gate and source terminals of the field-effect transistor, respectively. Switches alternatively intercouple the field-effect transistor to either another voltage supply or the first transistor.

19 Claims, 2 Drawing Sheets

DRIVING CIRCUIT FOR A FIELD EFFECT TRANSISTOR IN A FINAL SEMIBRIDGE STAGE

TECHNICAL FIELD

The present invention relates generally to driving circuits for driving field-effect transistors used in drive motors and inductive loads.

BACKGROUND OF THE INVENTION

As is known by those skilled in the art, the above-outlined structures are used extensively to drive motors and inductive loads in general, using either bipolar or the field-effect type transistors. The half-bridge structure, mainly using field-effect transistors, is specifically employed to drive brushless and stepper motors, and also to transmit high-voltage logic signals. In fact, wherever the implementing technology so allows, VDMOS (Vertical Double Diffused MOS) components are used as field-effect transistors on account of the many advantages that they afford over bipolar components.

The two field-effect transistors which form a half-bridge are connected in series with each other between the two terminals of a voltage supply generator, in other words between the "power supply" and the ground potential, and are alternately driven into conduction by control circuit means coupled to their gate terminals.

The voltage amplitude of the output signal from the linking node between the two transistors is both dependent on the output current and the saturation resistance of the conducting transistor.

To minimize the voltage drop between the power supply and the output, it is necessary to impose on the upper transistor, during the conduction phase, a gate voltage higher than the source voltage (usually about 10 V), to optimize the saturation resistance.

By methods well known to those skilled in the art, e.g. through the use of a voltage multiplier, a predetermined optimum voltage amount is established, which is higher than the supply voltage, and this higher voltage is applied, during the conduction phase, to the gate terminal of the upper transistor to provide optimum gate/source voltage independently of the supply voltage.

It is common practice to protect the upper transistor against unavoidable voltage peaks due to the turning on/off of the transistor—which are even higher than this optimum voltage—by means of two Zener diodes connected between the source and the drain, reversed one from the other.

The above problem does not exist with the lower transistor, which is automatically protected because it is driven by internally generated voltages. In addition, the source terminal of the lower transistor is always maintained at a reference potential, whereas the source terminal potential of the upper transistor may vary between the two potential levels of the voltage supply generator, that is to say between the "power supply" and the ground potential.

A conventional method of turning off the upper field-effect transistor is to pull the gate terminal of such transistor to ground via a depletion current generator connected in series with a switch to be closed during the off phase. The current generator may be connected to a reference voltage, and the switch may be another field-effect transistor driven to switch over.

An improvement on this arrangement has been provided in practice by connecting the gate terminal of the upper field-effect transistor to a depletion current generator, again via a switch, not directly but with the interposition of a PNP type of bipolar transistor, the emitter and collector terminals of said bipolar transistor being directly connected to the gate and source terminals respectively of the field-effect transistor and its base terminal being coupled to the ground depletion current generator via the switch.

The advantages of this arrangement for turning off the field-effect transistor are that the transistor's own gate capacitance discharge current can be dissipated directly to the load, and that upon turning back on, the gate terminal will already be at the same potential as the source terminal, which does not need to be the ground potential. Furthermore, the current from the depletion current generator is lowered by a factor equal to the PNP transistor gain.

Disadvantages inherent to this arrangement include the frequency limitations and increased integration area requirements of the bipolar transistor. Moreover, if a higher voltage than the voltage drop on the base/collector junction of the PNP transistor is imposed at the output, a pull from the output occurs through said junction.

Specifically in the instance of a half-bridge structure—but not in that of the High Side Driver—with the circuit configurations described herein used as a line driver, or for driving loads connected to the positive supply line, a further problem arises. When the upper transistor is turned off through the depletion current generator and the lower transistor turned back on, the potentials at the source and gate terminals of the upper stage transistor may be enough to turn this transistor back on, thereby an uncontrolled current would be produced, commonly referred in the art to as "cross-current".

SUMMARY OF THE INVENTION

The present invention relates to drive circuits for driving field-effect transistors, in particular, field-effect power transistors used either in the upper output stage of bridge or half-bridge circuit structures, or as the final stage of a structure commonly referred to as "High Side Driver," where the final stage includes a single output transistor connected to the positive supply pole.

The underlying technical problem of this invention is to provide a drive circuit for a field-effect transistor which is suitable for use in the upper stage of a half-bridge structure, which can operate at high switching rates with no cross-currents appearing during the switching phases irrespective of the load, and which can provide, in the event of the transistors being turned off simultaneously, a very high output impedance with no current draw.

This problem is solved by a drive circuit for field-effect transistors as defined in the claims.

The features and advantages of a drive circuit according to the invention will become apparent from the following description of an embodiment thereof, given by way of example and not of limitations with reference to the accompanying drawing.

DETAILED DESCRIPTION OF THE INVENTION

Figure 1:
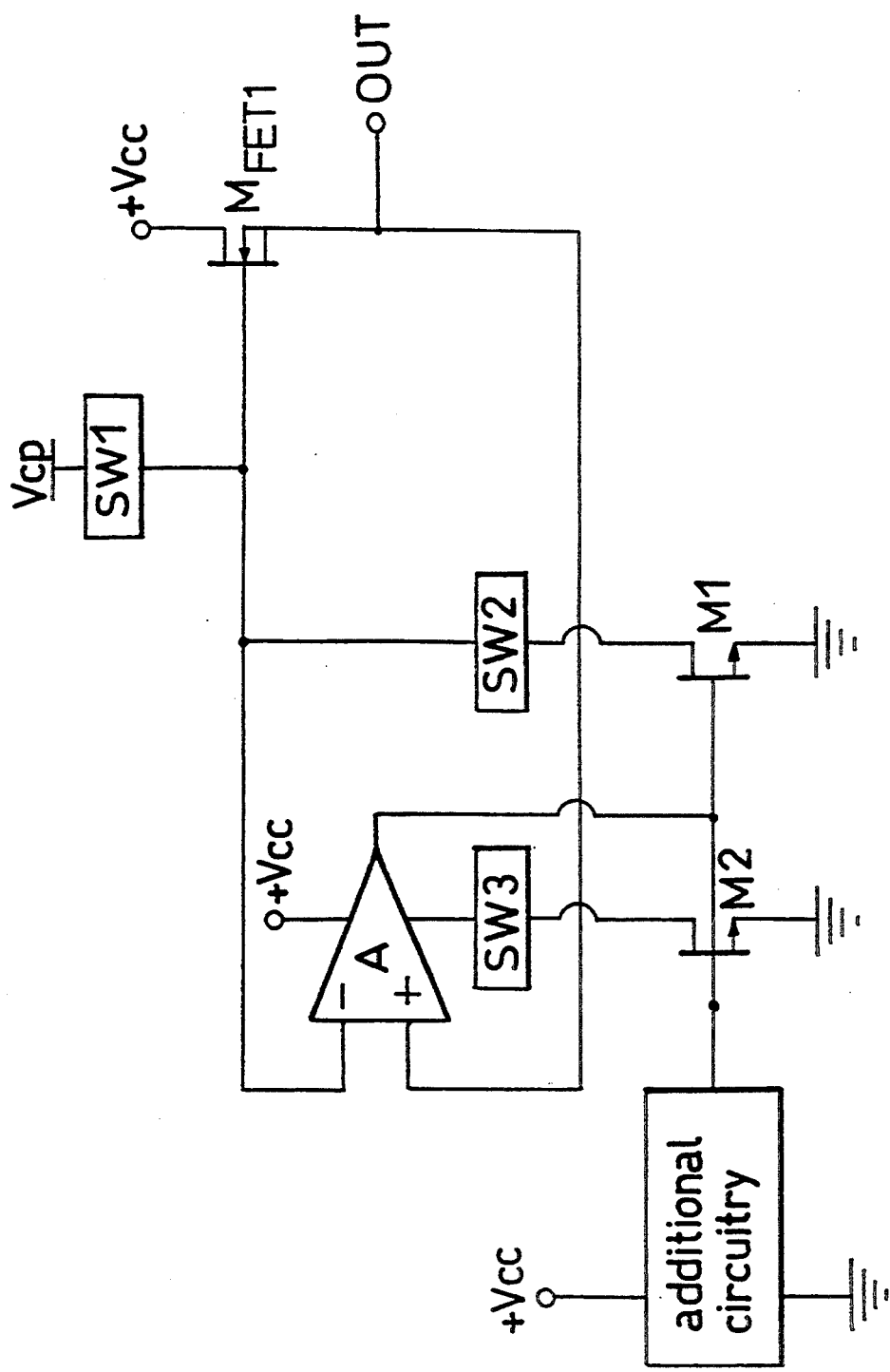
FIG. 1 is a basic block diagram of the driving circuit of the present invention.

FIG. 1 shows a field-effect transistor MFET1 connected to the drive circuit of the present invention. The drive circuit essentially comprises switches S1, S2 and S3, an operational amplifier A and transistors M1 and M2. The additional circuitry for the drive circuit is represented in FIG. 1 in a block labeled as such.

Figure 2:
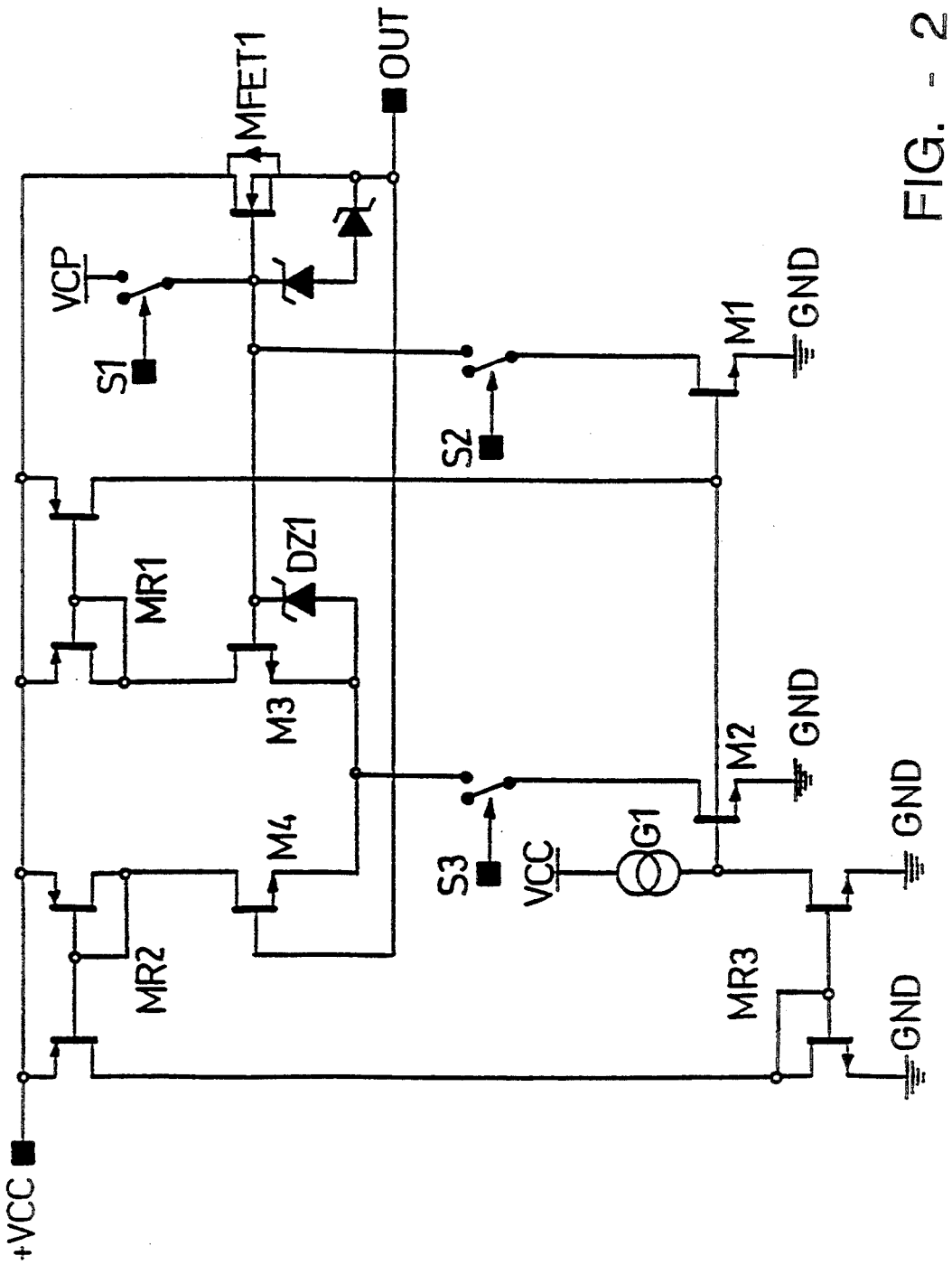
FIG. 2 is a circuit diagram showing a field-effect transistor for the upper stage of a half-bridge structure and a drive circuit according to this invention, which can be integrated monolithically using MOS-type or combination technologies.

FIG. 2 provides a more detailed representation of the drive circuit of the present invention. FIG. 2 shows the field-effect transistor MFET1, which may be a VDMOS type, having its source and drain terminals connected to an output terminal OUT and to a positive pole of a voltage supply generator +VCC, respectively.

The gate terminal of the transistor MFET1 is connected, via a switch S1, to a reference voltage VCP, having a higher potential than the pole +VCC. Two Zener diodes DZ2 and DZ3 are connected between the source and drain terminals of the transistor MFET1, respectively. The two Zener diodes are reversed from each other and, as discussed herein, protect the transistor against unavoidable voltage peaks.

The drive circuit for said transistor comprises a first transistor M1, which is connected in series with a second switch S2 between the gate terminal of transistor MFET1 and a negative pole of the voltage supply generator, i.e. ground potential, GND.

The gate terminal of transistor M1, and that of a second transistor M2, are connected to the pole +VCC through a constant current generator G1.

The second transistor M2 is connected, in series with a third switch S3, between a differential structure, comprising third M3 and fourth M4 transistors, and the ground potential GND. Switches S1, S2 and S3 are preferably DMOS transistors, although other switches known by those skilled in the art may be used (e.g., bipolar transistors, etc.).

The gate terminals of transistors M3 and M4 are connected to the gate terminal of transistor MFET1 and the output terminal OUT respectively.

A Zener diode DZ1 is connected between the switch S3 and the gate terminal of transistor MFET1.

The transistors M3 and M4 are connected to the input legs of first MR1 and second MR2 current mirror circuits respectively.

The output leg of circuit MR1 is connected to the gate terminal of transistor M1.

The output leg of circuit MR2 is connected, via a third current mirror circuit MR3, to the gate terminal of transistor M2.

The gate terminals of transistors M3 and M4 constitute the non-inverting and inverting input terminals of an operational amplifier which comprises the transistors M3, M4 and circuits MR1, MR3, and has its output connected to the gate terminal of transistor M1.

Control circuit means, not shown in the drawing, drives the switches; the switches S2 and S3 are in the turned off state only when the switch S1 is turned on, and vice versa.

Closing the switch S2 results in the transistor MFET1 being turned off through the charge depletion transistor M1.

Closing the switch S3, on the other hand, enables the operational amplifier to thereby set to operation the differential structure and the current mirror circuits through the transistor M2, having current generator functions.

The input stage of the operational amplifier is preferably implemented with field-effect devices, to avoid pulling current through the inputs whereby the source and gate voltages of the transistor MFET1 are measured. With this arrangement, no current will thus be pulled from the output in the instance of both transistors being off in the half-bridge structure.

The principle on which the illustrated circuit operates is the following.

With the switches S2 and S3 in the on state, the transistor MFET1 can be turned on by closing the switch S1 which brings the gate of MFET1 to the voltage VCP.

In the off state, the switch S1 opens the contact between the gate and the reference voltage VCP, while the switch S3 enables the operational amplifier. At this point, the gate of MFET1 is discharged from the transistor M1 driven by the operational amplifier so long as a potential difference exists across the operational amplifier inputs. Of course, the switch S2 should also be closed.

Thus, at the end of the transient period, by virtue of the negative feedback, the gate of transistor MFET1 will attain a balance voltage. The gate of transistor MFET1 attains a balance voltage by being tied both to the source voltage, i.e. the voltage at the output OUT, and the voltage established by means of the Zener diode DZ1.

During the on phase of transistor MFET1, the switch S1 will be closed, and the switches S2 and S3 open. Accordingly, the differential stage consisting of the transistors M3 and M4 will be disabled because it becomes disconnected from the transistor M2, and the gate of transistor MFET1 will be at the same voltage as VCP because it becomes disconnected from the transistor M1 and connected to the reference voltage VCP.

For turning off the transistor MFET1, the switch S1 is opened and both switches S2 and S3 closed. The differential stage comprising the transistors M3 and M4 will be enabled by the current pull by the transistor M2, presently in the on state, and the transistor M3, whose gate is at a higher potential than the gate potential of transistor M4 will go into conduction.

Simultaneously therewith, the gate of transistor MFET1 is discharged by transistor M1, and after a time period, will attain the same voltage level as the source of MFET1, whereupon the transistor M4 begins to conduct and transistor M3 turns to the off state. As soon as the transistor M4 begins to conduct, the current mirror circuits will also conduct, to generate a current which tends to turn off the transistors M1 and M2.

The gate of transistor MFET1 continues to be discharged until a balanced condition is reached wherein the transistor M3 is off, transistor M4 is on, Zener diode DZ1 is directly biased, and transistors M1 and M2 absorb the current that keeps flowing.

In conclusion, the advantages of a circuit according to the invention can be summarized as follows:

No current pull from the output, irrespective of the voltage value applied thereto;

in the instance of a half-bridge structure, and irrespective of the load, no cross-currents occurs during the switching phases, since the source and gate of the upper transistor MFET1 are measured any time; and high-frequency switching can take place without problems.

While an exemplary embodiment of the invention has been described and illustrated in the foregoing, changes and modifications may be made thereunto within the scope of the inventive concept.

As an example, the transistors M1, M2 and those comprising the current mirror circuits could be replaced with suitably biased bipolar transistors, and the constant current generator could be connected to a different voltage reference.

We claim:

1. A drive circuit for driving at least one field-effect transistor which has a first terminal for the connection to a positive pole of a voltage supply generator, a second terminal for the connection to a load, and a control terminal for the connection to a reference voltage having a higher potential than the positive pole of the voltage supply generator, comprising control circuit means driving a first switch connected between the voltage reference and the control terminal of the field-effect transistor, and circuit means for turning off the field-effect transistor; characterized in that said turn-off circuit means comprise an operational amplifier having a non-inverting input terminal connected to the control terminal of the field-effect transistor, an inverting input terminal connected to the second terminal of the field-effect transistor, an output terminal and at least one enable terminal coupled to the control circuit means; and comprising also a first transistor having a first terminal connected to the control terminal of the field-effect transistor, a second terminal connected to a negative pole of the voltage supply generator, and a control terminal connected to the output terminal of the operational amplifier.

2. A drive circuit according to claim 1, characterized in that a second switch, driven by the control circuit means, is connected between the control terminal of the field-effect transistor and the first terminal of the first transistor.

3. A drive circuit according to claim 2, characterized in that the operational amplifier is enabled by the control circuit means when the first switch is open and the second switch is closed.

4. A drive circuit according to claim 1, characterized in that the operational amplifier comprises an input stage with field-effect devices connected directly to the input terminals.

5. A drive circuit according to claim 1, characterized in that the enable terminal of the operational amplifier is connected to a current generator circuit means through a third switch driven by the control circuit means.

6. A drive circuit according to claim 5, characterized in that the current generator circuit means is a second transistor connected between the third switch and the negative pole of the voltage supply generator, and has a control terminal connected to the output terminal of the operational amplifier and also connected to the positive pole of the voltage supply generator via a constant current generator.

7. A circuit according to claim 6, characterized in that the operational amplifier has a differential input stage comprising third and fourth transistors, each having first and second terminals and a control terminal, the control terminals of the third and fourth transistors being the non-inverting terminal and the inverting terminal of the operational amplifier respectively, and the second terminal of each of said transistors being connected to the enable terminal of the operational amplifier.

8. A drive circuit according to claim 7, characterized in that the operational amplifier comprises first, second, and third current mirror circuits, each having an input leg and an output leg, the input and output legs of the first current mirror circuit being connected to the first terminal of the third transistor and to the control terminal of the first transistor respectively, the input and output legs of the second current mirror circuit being connected to the first terminal of the fourth transistor and to the input leg of the third current mirror circuit respectively, the output leg of such third mirror being the output terminal of the amplifier.

9. A drive circuit according to claim 7, characterized in that the operational amplifier comprises a Zener diode connected between the second terminal and the control terminal of the third transistor.

10. A circuit according to claim 1, characterized in that the first transistor is a field-effect transistor, and that the first and second terminals and the control terminal of each transistor are drain, source, and gate terminals respectively.

11. A drive circuit for driving a field-effect transistor, the field-effect transistor having first, second and control terminals, the drive circuit comprising: first and second poles of a first voltage supply, the first terminal coupled to the first pole of the first voltage supply;

a pole of a second voltage supply, the control terminal selectively coupled to the pole of the second voltage supply;

a first transistor coupled between the control terminal and the second pole of the first voltage supply;

an operational amplifier having inverting and non-inverting terminals coupled to the control terminal and second terminal, respectively, and an output for controlling the first transistor;

a first switch serially coupled between the first transistor and the control terminal, for selectively coupling the first transistor and the control terminal; and, a second switch serially coupled between the control terminal and the pole of the second voltage supply, the second switch for selectively coupling the control terminal and the pole of the second voltage supply.

12. A drive circuit according to claim 11 wherein the control, first and second terminals are the gate, drain and source terminals of the field-effect transistor, respectively, and the first and second poles of the first voltage supply are positive and negative poles, respectively.

13. A drive circuit according to claim 11, further comprising a current generator circuit and a third switch intercoupling the current generator circuit and the operational amplifier.

14. A drive circuit according to claim 13 wherein the current generator circuit comprises a second transistor coupled between the third switch and the second pole of the first voltage supply, and a current generator coupled between the first voltage supply and the second transistor.

15. A drive circuit according to claim 13, further comprising a current mirror circuit coupled between the current generator circuit and the second pole of the first voltage supply.

16. A drive circuit according to claim 13 wherein the second switch is open while the first and third switches are closed.

17. A drive circuit according to claim 11 wherein the operational amplifier includes a third transistor having first, second and control transistor terminals, the control transistor terminal coupled to the control terminal of the field-effect transistor and the second transistor terminal being an enable terminal of the operational amplifier.

18. A drive circuit according to claim 17 comprising a Zener diode coupled between the second and control transistor terminals of the third transistor.

19. A drive circuit according to claim 11, further comprising at least one Zener diode intercoupling the control and second terminals.

* * * * *